United States Patent [19]
Gardner et al.

[11] Patent Number: 5,849,621
[45] Date of Patent: *Dec. 15, 1998

[54] METHOD AND STRUCTURE FOR ISOLATING SEMICONDUCTOR DEVICES AFTER TRANSISTOR FORMATION

[75] Inventors: Mark I. Gardner; Fred N. Hause; H. Jim Fulford, Jr., all of Austin, Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 666,023

[22] Filed: Jun. 19, 1996

[51] Int. Cl.⁶ .................................................. H01L 21/76
[52] U.S. Cl. ........................................ 438/279; 438/296
[58] Field of Search .................... 438/296, 279, 438/305

[56] References Cited

U.S. PATENT DOCUMENTS

| | | | |
|---|---|---|---|
| 4,506,434 | 3/1985 | Ogawa et al. | 438/296 |
| 4,532,696 | 8/1985 | Iwai | 438/296 |
| 4,683,637 | 8/1987 | Varker et al. | 438/296 |
| 4,980,306 | 12/1990 | Shimbo . | |
| 5,015,601 | 5/1991 | Yoshikawa | 438/296 |
| 5,282,160 | 1/1994 | Yamagata . | |
| 5,387,534 | 2/1995 | Prall | 438/296 |
| 5,424,569 | 6/1995 | Prall . | |
| 5,614,430 | 3/1997 | Liang et al. | 438/296 |
| 5,741,735 | 4/1998 | Violette et al. | 438/279 |

FOREIGN PATENT DOCUMENTS 0 547 711 A2   6/1993   European Pat. Off. .

OTHER PUBLICATIONS

International Search Report for PCT/US 97/02492 dated Jun. 11, 1997.

*Primary Examiner*—Richard A. Booth
*Attorney, Agent, or Firm*—Conley, Rose & Tayon; Robert C. Kowert; Kevin L. Daffer

[57] ABSTRACT

A method for isolating semiconductor devices comprising providing a semiconductor substrate. The semiconductor substrate includes laterally displaced source/drain regions and channel regions. First and second laterally displaced MOS transistors are formed partially within the semiconductor substrate. The first and second transistors have a common source/drain region. An isolation trench is formed through the common source/drain region and the trench is filled with a trench dielectric material such that the common source/drain region is divided into electrically isolated first and second source/drain regions whereby the first transistor is electrically isolated from the second transistor.

18 Claims, 2 Drawing Sheets

METHOD AND STRUCTURE FOR ISOLATING SEMICONDUCTOR DEVICES AFTER TRANSISTOR FORMATION

BACKGROUND OF THE INVENTION

1. Field of the Invention

This invention relates to the field of semiconductor processing and more particularly to a method for isolating transistors after formation of the transistor devices.

2. Description of the Relevant Art

In a metal-oxide-semiconductor (MOS) integrated circuit, a plurality of transistors are fabricated within and upon a monolithic semiconductor substrate typically comprising doped silicon. To effectively isolate individual transistors from one another so that the individual devices may be selectively interconnected to achieve a desired function, isolation structures must be included in the integrated circuit. In the absence of adequate isolation structures, an individual transistor could undesirably become electrically coupled to a neighboring transistor. Such undesirable and unpredictable coupling of transistors within a semiconductor can render the device non-functional.

Historically, the predominant MOS isolation method has been the local oxidation (LOCOS) process. In the LOCOS process, as is well known in the field of semiconductor processing, a relatively thick thermal oxide film is formed between the source/drain regions of neighboring transistor devices. The thermally grown oxide film, commonly referred to as the field oxide, consumes silicon within the silicon substrate surface such that the field oxide tends to form partially within and partially upon the silicon substrate. More specifically, approximately 45% of a field oxide film will extend into the silicon substrate while the remaining 55% grows above the silicon substrate upper surface. Field oxide formation is suppressed in regions of the silicon substrate wherein active devices will subsequently be formed by depositing a layer of silicon nitride over the active regions prior to the formation of the field oxide. The silicon nitride is typically deposited on a thin "pad" oxide to relieve the stress that silicon nitride films impart to a silicon surface. The thick field oxide film serves to isolate active regions displaced on either side of the field oxide film. To enhance the isolation capabilities of the field oxide, an implant is commonly performed to introduce impurities into a region under the field oxide. The polarity or conductivity type of the impurity introduced under the field oxide film is opposite the conductivity type of the subsequently formed source/drain regions.

Typical LOCOS field oxide films grow with a characteristic bird's beak structure that extends partially into the active regions of the neighboring transistors. This encroachment upon the transistor active region by the field oxide structure coupled with the portion of the field oxide that forms above the semiconductor substrate surface results in a non-planar surface upon which the transistors must be subsequently formed. As the geometries of semiconductor devices decrease below the sub 0.5 micron range, the planarity of the surface upon which transistors are formed becomes increasingly important. For example, short-channel effects (SCE), which can result in increased subthreshold leakage, can become exaggerated when transistors are formed upon a non-planar surface.

One method of improving the planarity of MOS isolation structures is the shallow trench isolation (STI) process. In an STI process, a trench is etched into the silicon substrate and subsequently filled with a dielectric material, typically an oxide. A planarization step is then performed to remove the oxide from regions exterior to the isolation trench. Ideally, the upper surface of the semiconductor substrate is completely planar after the planarization of the trench dielectric. Although the STI process is theoretically capable of producing a planar surface upon which transistors can be formed, significant processing is required to achieve the planar surface prior to the formation of the transistors. Specifically, it may be necessary to perform a number of chemical-mechanical polish steps, possibly in combination with some selective masking steps and some plasma etch steps to achieve the desired planarity. The incorporation of these processing steps prior to the formation of a gate dielectric is generally undesirable because of the increased potential for generating defects in critical regions of the silicon substrate and because of the high particle counts associated with these planarization processing steps.

In both the LOCOS process and the STI process, the isolation dielectric must be formed with an initial thickness substantially greater than the final desired thickness of the film. The additional film thickness is necessary because of the presence of subsequent processing steps that reduce the isolation dielectric thickness. More specifically, the typical transistor formation process includes cleaning and wafer preparation steps that require immersion in a 10:1 solution of HF. In addition, the incorporation of "spacer" structures into many MOS processes necessitates a spacer etch step. The HF dip process steps and spacer etch process step attack the isolation dielectric and reduce the isolation film thickness. Thus, the original film thickness must be increased to compensate for these film-reducing process steps. Since thicker films generally require more processing time, the need to overgrow or "over deposit" the isolation dielectric is an undesirable result. In addition, the numerous post-formation processing steps that attack the isolation dielectric make it more difficult to control the final film thickness. To accommodate the film thickness variations that can result because of the multiple processing steps that etch the isolation dielectric, the process specification must be relaxed. Generally, it is more desirable to have a narrow specified range for any given process parameter to reduce the variability in the operating characteristics of the finished product.

Therefore, it is desirable to implement a semiconductor process in which the gate dielectric and subsequent transistor formation processing steps are performed upon a planar silicon substrate without requiring a significant increase in the pre-transistor formation processing. It is further desirable to reduce or eliminate the number of oxide etch steps to which the isolation dielectric is subjected.

SUMMARY OF THE INVENTION

The problems identified above are in large part addressed by a semiconductor process in which the isolation structure is formed subsequent to the formation of the transistor devices. By delaying the formation of the isolation structure until after the transistor formation, the improved process hereof provides a planar surface upon which to form the transistors without requiring a significant increase in pre-transistor formation or "front end" processing. By providing a planar surface, the present invention enables the precise formation of submicron transistor regions. In addition, the improved process, by forming the isolation dielectric after transistor formation, reduces the amount by which the isolation dielectric must be formed in excess of the desired film thickness and reduces therewith the final film thickness variability.

Broadly speaking, the present invention contemplates a method for isolating semiconductor devices. A semiconductor substrate is provided having laterally displaced source/drain regions and channel regions. First and second MOS transistors are then formed, laterally displaced from one another, within the semiconductor substrate. The first and second transistors have a common source/drain region. An isolation trench is then formed through the common source/drain region. The trench is then filled with a dielectric material to divide the common source/drain region into electrically isolated first and second source/drain regions so that the first transistor is electrically isolated from the second transistor.

In a presently preferred embodiment, the formation of the laterally displaced first and second transistors comprises forming a gate dielectric layer on an upper surface of the semiconductor substrate, and forming a conductive layer on the gate dielectric layer. Next, a portion of the gate conductive layer is selectively removed over the source/drain regions of the semiconductor substrate. A first concentration of a first source/drain impurity is then introduced into the source/drain regions. The gate dielectric is preferably comprised of a thermal oxide film having a thickness between 25 and 200 angstroms. The gate conductive layer typically comprises heavily doped, chemical vapor deposited (CVD) polysilicon. The first source/drain impurity typically comprises boron, arsenic, or phosphorus ions. The isolation trench preferably includes substantially vertical sidewalls and a trench floor which is substantially parallel to an upper surface of the semiconductor substrate. The trench preferably has a depth of approximately 1500 to 2500 angstroms.

The present invention further contemplates a method of fabricating a semiconductor device. A semiconductor substrate having laterally displaced source/drain regions and channel regions in an upper region of the substrate is provided. The substrate includes a common source/drain region laterally displaced between a first channel region and a second channel region. First and second gate structures are then formed on the semiconductor substrate over the first and second channel regions respectively. A first impurity is then introduced into the common source/drain region. The first impurity substantially resides above a first depth below an upper surface of the semiconductor substrate. A trench, laterally displaced between the pair of source/drain regions, is formed in the semiconductor substrate. The trench has a floor situated at a trench depth below the upper surface of the semiconductor substrate. Preferably, the trench depth is greater than the first depth. Thereafter, the trench is filled with a dielectric material whereby the common source/drain region is divided into electrically isolated first and second source/drain regions.

Preferably, the formation of the gate structures on the semiconductor substrate comprises forming a gate dielectric layer on an upper surface of the semiconductor substrate, forming a conductive layer on the gate dielectric layer and selectively removing portions of the gate conductive layer over the source/drain regions. In one embodiment, the first and second gate structures include a pair of substantially vertical sidewalls. Spacer structures are formed on the sidewalls to shadow peripheral portions of the source/drain regions. In this embodiment, a second impurity is introduced into the source/drain regions. The second impurity substantially resides within a region of the upper surface above a second depth below the substrate. Preferably, the second impurity is present in the semiconductor substrate in a greater concentration than the first impurity and the second depth is greater than the first depth.

The present invention still further contemplates a semiconductor structure comprising a semiconductor substrate having a substrate conductivity type. An upper region of the semiconductor substrate includes a trench-shaped void. The semiconductor substrate further includes first and second source/drain regions in the upper region of the semiconductor substrate. The first and second source/drain regions include a first concentration of a first impurity. The first impurity has a first conductivity type opposite to a conductivity type of the semiconductor substrate. The trench-shaped void is laterally displaced between the first and second source/drain regions. The trench-shaped void extends from an upper surface of the semiconductor substrate to a trench floor substantially parallel to the upper surface. The trench-shaped void preferably has a depth of approximately 1500 to 2500 angstroms. In one embodiment, the first and second source/drain regions further include a second concentration of a second impurity. The first and second impurities have like conductivity types. Preferably, the trench-shaped void contains a trench dielectric having an upper region that is free of the first impurity.

BRIEF DESCRIPTION OF THE DRAWINGS

Other objects and advantages of the invention will become apparent upon reading the following detailed description and upon reference to the accompanying drawings in which.

Figure 1:
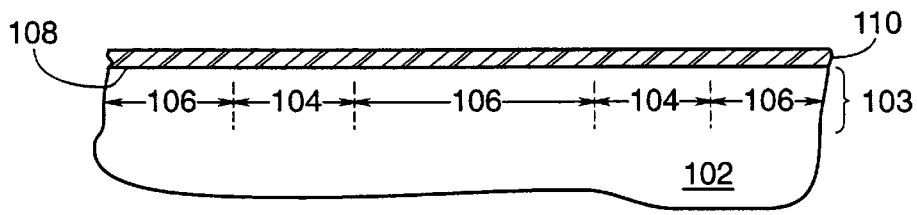
FIG. 1 is a partial cross-sectional view of a semiconductor substrate upon which a gate dielectric layer has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 6:
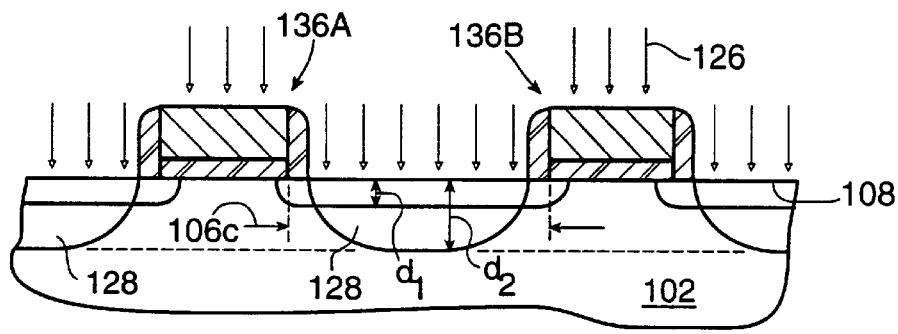
FIG. 6 is a processing step subsequent to FIG. 5 in which a second impurity has been introduced into the source/drain regions of the semiconductor substrate.
Figure 7:
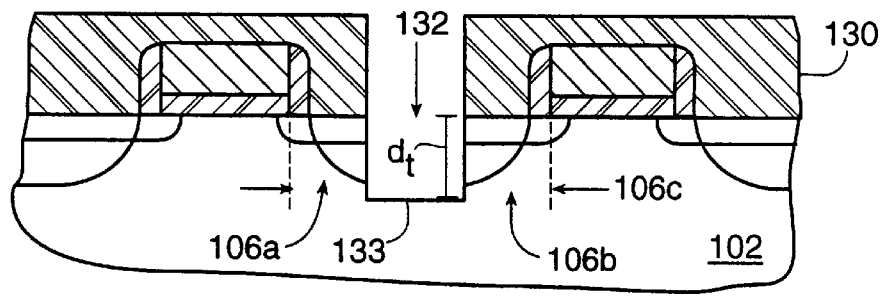
FIG. 7 is a processing step subsequent to FIG. 6 in which a photoresist layer has been deposited on the semiconductor topology and a trench dielectric formed through a portion of the common source/drain region.
Figure 8:
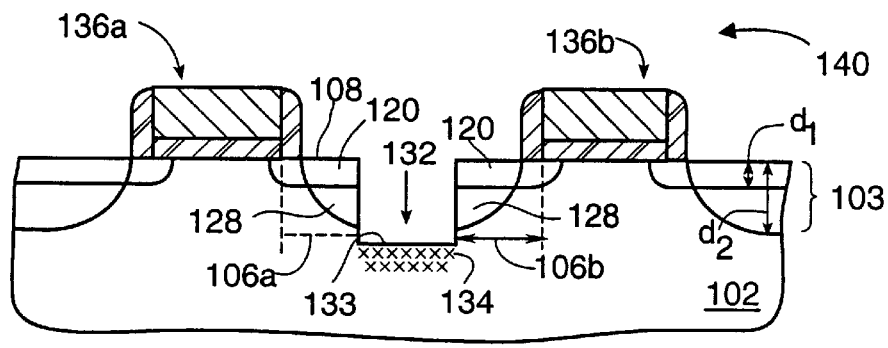
FIG. 8 is a processing step subsequent to FIG. 7 showing a channel stop impurity introduced into the semiconductor substrate below the isolation trench.

Turning now to the drawings, FIGS. 1–9 depict a presently preferred embodiment of a sequence of processing steps used to form a pair of isolated transistors partially formed within a monolithic semiconductor substrate. Turning briefly to FIG. 8, semiconductor structure 140 is shown. Structure 140 includes semiconductor substrate 102 having an upper region 103 that includes a trench-shaped void 132. Structure 140 further includes first and second source/drain regions 106a and 106b of first and second transistors 136a and 136b respectively partially within upper region 103 of substrate 102. First and second source/drain regions 106a and 106b include a first concentration 120 of a first impurity. The first impurity has a conductivity type opposite to a conductivity type of semiconductor substrate 102. Trench-shaped void 132 is laterally displaced between first source/drain region 106a and second source/drain region 106b. Trench-shaped void 132 extends from upper surface 108 of substrate 102 to trench floor 133. In the embodiment shown in FIG. 8, structure 140 further includes a second concentration 128 of a second impurity having a like conductivity type as the first impurity. Preferably, first concentration 120 of the first impurity is substantially confined to a portion of upper region 103 above a first depth $d_1$ (FIG. 6) below upper surface 108. Second concentration 128 of the second impurity is substantially confined to a portion of upper region 103 above a second depth $d_2$ (FIG. 6) below upper surface 108 of substrate 102. In the preferred embodiment, trench floor 133 is situated at a depth $d_t$ (FIG. 7) below upper surface 108 of substrate 102. In the presently preferred embodiment, $d_t$ is greater than $d_2$ which is greater than $d_1$.

Figure 2:
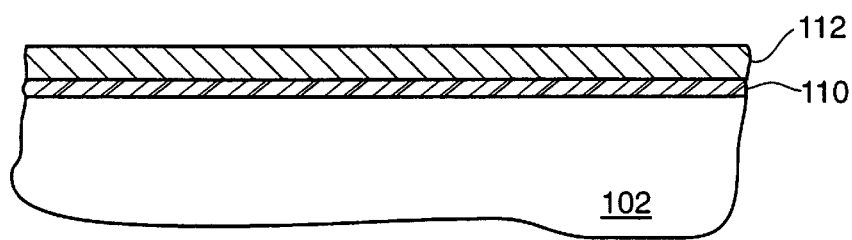
FIG. 2 is a processing step subsequent to FIG. 1 in which a gate conductive layer has been formed on the gate dielectric layer.

Returning to FIG. 1, a process sequence is shown for forming structure 140. In FIG. 1, a gate dielectric layer 110 is formed on upper surface 108 of semiconductor substrate 102. Semiconductor substrate 102 preferably comprises monolithic single crystal silicon. Upper region 103 of semiconductor substrate 102 includes laterally displaced channel regions 104 and source/drain regions 106. In the presently preferred embodiment, gate dielectric layer 110 comprises a thermally grown silicon dioxide ($SiO_2$) film ranging in thickness from 25 to 200 angstroms. Turning to FIG. 2, gate conductive layer 112 is formed upon gate dielectric layer 110. Gate dielectric layer 110 preferably comprises heavily doped chemically vapor deposited polysilicon as is well known in the art. See, e.g., S. Wolf and R. N. Tauber, *Silicon Processing For the VLSI Era, Volume 1—Process Technology*, pp. 175–182 (Lattice Press, Sunset Beach, Calif., 1986). For purposes of this disclosure, "heavily doped polysilicon" includes any polysilicon film having a sheet resistivity of 500 Ω/sq or less.

Figure 3:
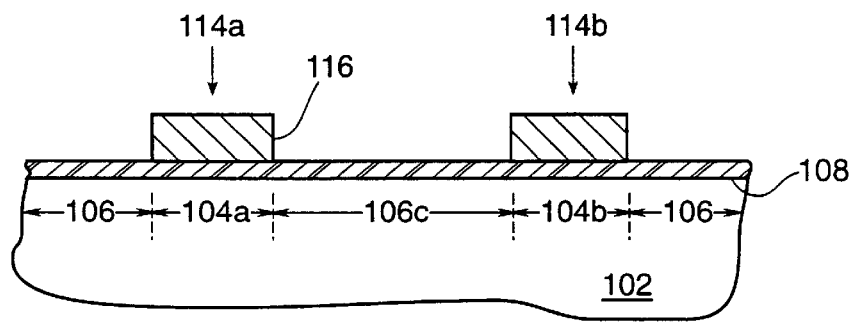
FIG. 3 is a processing step subsequent to FIG. 2 in which portions of the gate conductive layer have been selectively removed over the source/drain regions of the semiconductor substrate.
Figure 4:
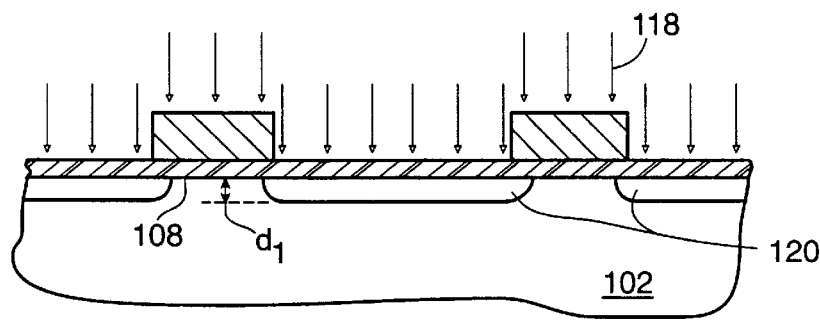
FIG. 4 is a processing step subsequent to FIG. 3 in which a first impurity has been introduced into the source/drain regions of the semiconductor substrate.

Turning to FIG. 3, portions of gate conductive layer 112 are selectively removed over source/drain regions 106 of substrate 102. Selective removal of portions of gate conductive layer 112 results in the formation of first gate structure 114a and second gate structure 114b. In a presently preferred embodiment, gate structures 114a and 114b include sidewalls 116 which are substantially perpendicular to upper surface 108 of substrate 102. First gate structure 114a is formed over first channel region 104a while second gate structure 114b is formed over second channel region 104b of substrate 102. As shown in FIG. 3, substrate 102 includes common source/drain region 106c laterally displaced between first channel region 104a and second channel region 104b. Turning to FIG. 4, a first concentration 120 of a first impurity is introduced into source/drain regions 106 of substrate 102 including common source/drain region 106c. First concentration 120 resides substantially above a first depth $d_1$ below upper surface 108 of substrate 102. In one embodiment of the invention, first concentration 120 comprises the lightly doped drain (LDD). The introduction of first concentration 120 into substrate 102 is preferably accomplished with an ion implantation step, shown in the FIG. 4 as reference 118. Impurities used to form first concentration 120 preferably include phosphorus and arsenic for N-channel devices and boron for P-channel devices.

Figure 5:
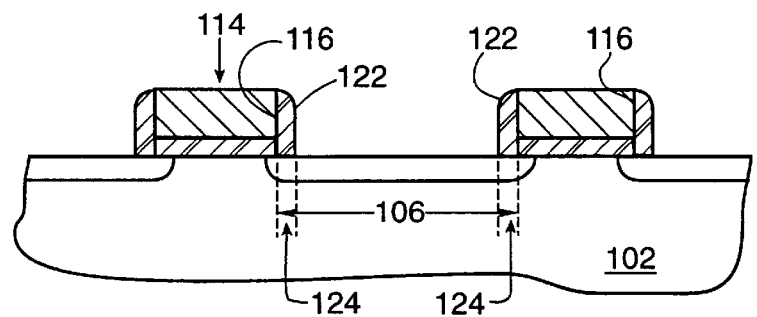
FIG. 5 is a processing step subsequent to FIG. 4 in which spacer structures have been formed on the sidewalls of the gate structures.

Turning now to FIG. 5, an optional processing step is shown for an embodiment in which it is desired to implement LDD transistors. LDD structures are described in S. Wolf, *Silicon Processing for the VLSI Era, Volume 3—The Submicron MOSFET*, pp. 591–637 (Lattice Press, Sunset Beach, Calif., 1995). FIG. 5 shows spacer structures 122 formed on sidewalls 116 of gate structures 114. In a preferred embodiment, spacer structure 122 is formed by blanket depositing a CVD oxide film on the semiconductor topology of FIG. 4 and performing an anisotropic plasma etch purposefully leaving behind spacer structures 122 on sidewalls 116. Spacer structures 122 effectively shadow peripheral portions 124 of channel regions 106. Turning to FIG. 6, a second concentration 128 of a second impurity is introduced into portions of source/drain regions 106 not shadowed by spacer structures 122. Second concentration 128 substantially resides within a region of semiconductor substrate 102 above a second depth $d_2$ below upper surface 108 of substrate 102. As shown, FIG. 6 discloses laterally displaced first transistor 136a and second transistor 136b formed partially within substrate 102 and having a common source/drain region 106c.

Turning to FIG. 7, isolation trench 132 is formed in semiconductor substrate 102 laterally displaced within common source/drain region 106c. Trench 132 is formed to a depth $d_t$ wherein $d_t$ is greater than $d_1$ and $d_2$ such that trench floor 133 resides below first concentration 120 and second concentration 128. Trench 132 therefore physically divides common source/drain region 106c into first source/drain region 106a and second source/drain 106b. In a presently preferred embodiment, trench 132 is formed by depositing photoresist layer 130, selectively removing portions of photoresist layer 130 with a conventional photolithography sequence, and plasma etching the regions of silicon substrate 102 exposed by the removed photoresist, all as is well known in the art. To further improve the isolation of first source/drain region 106a and second source/drain region 106b, impurities 134 (shown in FIG. 8) are introduced into semiconductor substrate 102 under trench floor 133 of trench 132. Impurities 134 are of a like conductivity type as semiconductor substrate 102 and of opposite conductivity type from first concentration 120 and second concentration 128 of source/drain regions 106. Masking layer 130 can alternatively comprise a dielectric such as CVD oxide. In a preferred embodiment, the depth $d_t$ of trench 132 is approximately 1500 to 2500 angstroms. The trench can be formed at this relatively shallow range because the isolation dielectric will not be subjected to the numerous oxide etch steps incorporated into the transistor formation process. FIG. 8 shows a subsequent processing step in which masking layer 130 has been removed.

Figure 9:
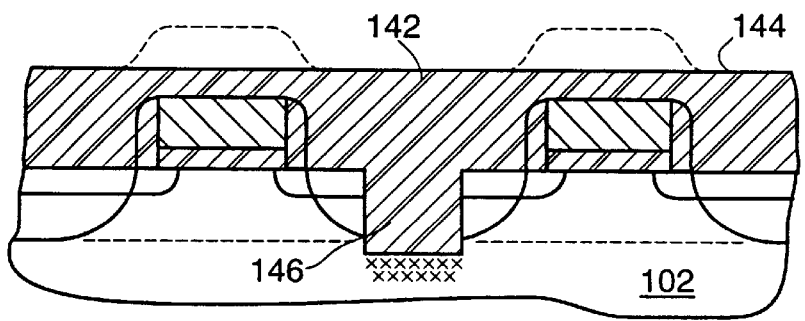
FIG. 9 is a processing step subsequent to FIG. 8 in which the isolation trench has been filled with a dielectric material and the dielectric material has been subsequently planarized.

Turning to FIG. 9, the process sequence is completed by filling trench-shaped void 132 with dielectric material 142. Dielectric material 142 preferably comprises a CVD oxide. FIG. 9 depicts dielectric 142 after completion of a planarization process, preferably a chemical-mechanical polish possibly in combination with photolithography masking steps and dry etch processing, such that dielectric material 142 has a substantially planar upper surface 144. Dielectric material 142 removed by the planarization process is shown in FIG. 9 in phantom. Because trench dielectric 146, which comprises trench material 142 within trench-shaped void 132, is formed after the formation of first transistor 136a and second transistor 136b, trench dielectric 146 is free of impurities used to form first concentration 120 and second concentration 128. Because conventionally formed isolation dielectrics are subjected to subsequent implantation steps including source/drain implants, threshold adjust implants, and channel stop implants, trench dielectric 146 is distinguishable. In a presently preferred embodiment, trench dielectric 146 has a thickness of approximately 1500 to 2500 angstroms.

It will be appreciated to those skilled in the art having the benefit of this disclosure that this invention is capable of providing a method for forming a transistor upon a planar semiconductor substrate surface prior to the formation of an isolation structure. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of fabricating a semiconductor device, comprising:

providing a semiconductor substrate, an upper region of said semiconductor substrate having laterally displaced source/drain regions and channel regions including a common source/drain region laterally displaced between a first channel region and a second channel region;

forming a first and a second gate structure on said semiconductor substrate over said first and second channel regions respectively;

introducing a first concentration of a first impurity into said common source/drain region, wherein said first concentration of said first impurity substantially resides above a first depth below an upper surface of said semiconductor substrate;

introducing a second concentration of a second impurity into said common source/drain region, wherein said second concentration of said second impurity substantially resides above a second depth greater than said first depth below an upper surface of said semiconductor substrate;

subsequent to said introducing said first and second impurities into said common source/drain region, forming a trench in said semiconductor substrate wherein said trench is laterally displaced within said common source/drain region and wherein a floor of said trench is situated at a third depth greater than said second depth below said upper surface of said semiconductor substrate;

depositing a trench dielectric material within said trench and upon upper surfaces of said first and second gate structures such that said common source/drain region is divided into electrically isolated first and second source/drain regions; and planarizing portions of said trench dielectric material extending above said first and second gate structures and said trench.

2. The method of claim 1, wherein the step of forming said first and second gate structures on said semiconductor substrate comprises:

forming a gate dielectric layer on said upper surface of said semiconductor substrate;

forming a gate conductive layer on said gate dielectric layer; and selectively removing portions of said gate conductive layer over said source/drain regions.

3. The method of claim 2, wherein forming said gate dielectric layer comprises growing a thermal oxide approximately 25 to 200 angstroms in thickness and wherein forming said gate conductive layer comprises chemically vapor depositing polysilicon.

4. The method of claim 3, further comprising doping said polysilicon to a sheet resistivity of 500 $\Omega$/sq or less.

5. The method of claim 4, wherein forming said first and second gate structures comprises patterning a pair of sidewalls substantially perpendicular to said upper surface of said semiconductor substrate, and wherein said method further comprises forming spacer structures on said perpendicular sidewalls of said first and second gate structures such that said spacer structures effectively shadow peripheral portions of said source/drain regions.

6. The method of claim 5, wherein said second concentration of said second impurity is introduced into portions of said semiconductor substrate not shadowed by said spacers such that substantially none of said second impurity is introduced into portions of said semiconductor substrate shadowed by said spacers.

7. The method of claim 5, wherein said first impurity comprises arsenic ions and said second impurity comprises phosphorous ions.

8. The method of claim 1, wherein said trench is formed to a depth of approximately 1500 to 2500 angstroms.

9. The method of claim 1, wherein forming said trench comprises etching substantially vertical sidewalls and a trench floor substantially parallel to said upper surface of said semiconductor substrate.

10. The method of claim 1, further comprising introducing a channel stop impurity into a portion of said semiconductor substrate below said trench, wherein said channel stop impurity and said semiconductor substrate are of the same conductivity type.

11. The method of claim 1, wherein an upper region of said trench dielectric material within said trench is free of said first and second impurities.

12. A method for isolating semiconductor devices, comprising:

providing a semiconductor substrate, wherein said semiconductor substrate includes laterally displaced source/drain regions and channel regions;

forming laterally displaced first and second transistors partially within said semiconductor substrate, wherein said first and second transistors have a common source/drain region and wherein said first and second transistors comprise first and second gate structures, respectively, having sidewalls substantially perpendicular to an upper surface of said semiconductor substrate;

forming an isolation trench through said common source/drain region;

depositing a trench dielectric material within said trench and upon upper surfaces of said transistors such that said common source/drain region is divided into electrically isolated first and second source/drain regions to electrically isolate said first transistor from said second transistor; and planarizing said trench dielectric extending above said first and second transistors and said trench.

13. The method as recited in claim 12, wherein said first and second transistors comprise MOS transistors.

14. The method of claim 12, wherein forming said isolation trench comprises etching substantially vertical sidewalls and a trench floor substantially parallel to said upper surface of said semiconductor substrate.

15. The method of claim 12, further comprising forming spacer structures on said substantially perpendicular sidewalls of said first and second gate structures such that said spacer structures effectively shadow peripheral portions of said source/drain regions.

16. The method as recited in claim 12, wherein forming said laterally displaced first and second transistors comprises:

prior to forming said trench, introducing a first concentration of a first impurity into said common source/drain region, wherein said first concentration of said first impurity substantially resides above a first depth below an upper surface of said semiconductor substrate; and prior to forming said trench, introducing a second concentration of a second impurity into said common source/drain region, wherein said second concentration of said second impurity substantially resides above a second depth below an upper surface of said semiconductor substrate.

17. The method of claim 16, further comprising forming spacer structures on said substantially perpendicular sidewalls of said first and second gate structures such that said spacer structures effectively shadow peripheral portions of said source/drain regions, and wherein said second concentration of said second impurity is introduced into portions of said semiconductor substrate not shadowed by said spacers such that substantially none of said second impurity is introduced into portions of said semiconductor substrate shadowed by said spacers.

18. The method of claim 15, wherein an upper region of said trench dielectric material within said trench is free of said first and second impurities.

* * * * *